(12) United States Patent
Winsor

(10) Patent No.: US 10,714,912 B2
(45) Date of Patent: Jul. 14, 2020

(54) SWITCH CABINET WITH A SIDE PANEL, A RELATED METHOD AND A RELATED BAY OF SWITCH CABINETS

(71) Applicant: RITTAL GMBH & CO. KG, Herborn (DE)

(72) Inventor: Derek Winsor, Devon (GB)

(73) Assignee: RITTAL GMBH & CO. KG, Herborn (DE)

( * ) Notice: Subject to any disclaimer, the term of this patent is extended or adjusted under 35 U.S.C. 154(b) by 0 days.

(21) Appl. No.: 16/426,301

(22) Filed: May 30, 2019

(65) Prior Publication Data
US 2019/0379183 A1    Dec. 12, 2019

(30) Foreign Application Priority Data

Jun. 11, 2018   (EP) ..................................... 18176919

(51) Int. Cl.
*H02B 1/01*   (2006.01)
*H02B 1/30*   (2006.01)
*H05K 9/00*   (2006.01)

(52) U.S. Cl.
CPC ............... *H02B 1/30* (2013.01); *H05K 9/009* (2013.01); *H05K 9/0015* (2013.01)

(58) Field of Classification Search
USPC ........................................................ 361/829
See application file for complete search history.

(56) References Cited

U.S. PATENT DOCUMENTS

| | | | | |
|---|---|---|---|---|
| 4,265,039 A | * | 5/1981 | Brooks | G09F 13/04 160/395 |
| RE34,393 E | * | 9/1993 | McIlwraith | H05K 7/183 312/265.4 |
| 8,544,384 B1 | * | 10/2013 | Niswonger | B41F 15/34 101/127.1 |
| 9,029,714 B2 | * | 5/2015 | Winch | H05K 9/0001 174/377 |
| 2012/0289107 A1 | * | 11/2012 | Beissinger | D04H 13/00 442/1 |
| 2014/0008119 A1 | | 1/2014 | Brandt | |
| 2018/0027706 A1 | | 1/2018 | Winch et al. | |

FOREIGN PATENT DOCUMENTS

DE        102015121193 A1    6/2017

OTHER PUBLICATIONS

European Search Report in Application No. EP 18176919.1 dated Dec. 21, 2018.

* cited by examiner

*Primary Examiner* — Hung S. Bui
(74) *Attorney, Agent, or Firm* — Harness, Dickey & Pierce, P.L.C.

(57) ABSTRACT

A switch cabinet which has a plurality of vertical frame profiles, whereby outer vertical planes (V) are defined, wherein at least one side panel of the switch cabinet is arranged in at least one of the vertical planes (V), characterized in that the side panel consists at least partially of a fabric with metallic or metallically coated threads or fibers. Furthermore, a related method and a related bay of cabinets are described.

14 Claims, 5 Drawing Sheets

SWITCH CABINET WITH A SIDE PANEL, A RELATED METHOD AND A RELATED BAY OF SWITCH CABINETS

CROSS-REFERENCE TO RELATED APPLICATIONS

This application is a claims the benefit and priority of European Application No. 18176919.1, filed Jun. 11, 2018. The entire disclosure of the above application is incorporated herein by reference.

FIELD

The invention is based on a switch cabinet having a plurality of vertical frame profiles that define outer vertical planes, wherein at least one side panel of the switch cabinet is arranged in at least one of the vertical planes. Such a switch cabinet is known from DE 10 2015 121 193 B4.

BACKGROUND

This section provides background information related to the present disclosure which is not necessarily prior art.

The side panels of a switch cabinet are usually formed as flat parts of a bent sheet metal. In the baying situation, where several switch cabinets form a bay of switch cabinets, this represents a disadvantage in that the material thickness of the side panels makes baying difficult. On the other hand, in applications that require shielding against electromechanical radiation, it is also not possible to forgo the adjacent side panels of the bayed switch cabinets.

SUMMARY

This section provides a general summary of the disclosure, and is not a comprehensive disclosure of its full scope or all of its features.

The object of the invention is therefore to develop a cabinet of the type described above, such that it has an effective electromagnetic shield and a small structural dimension of its side panel.

Accordingly, it is provided that the side panel consists at least partially of a fabric with metallically coated threads or fibers. It has been found that such fabrics effectively shield against electromagnetic radiation, even at a thickness of less than 0.1 mm. By way of example, a metallic coated polyester fabric having a thickness of 0.1 mm and a basis weight of 80 g/m$^2$, and 80 to 90 dB shielding in a frequency range between 100 MHz and 18 GHz may be mentioned.

The threads or fibers of the fabric may have a polyester core with a metallic sheathing, in particular a copper and/or nickel sheathing. In one embodiment of the invention, the polyester core is initially coated with a nickel layer, which is then coated with a copper layer, and which in turn is coated with a further nickel layer, such that the copper layer becomes embedded between the two nickel layers.

In the switch cabinet, two side panels of the switch cabinet arranged in opposite outer vertical planes and opposite one another may be formed at least partially using the same fabric web.

The fabric conceivably extends in a single piece from a first of two outer vertical planes, from where it is guided by 90° into the horizontal plane, and then extends in one piece via a further 90° redirection into the opposite outer vertical plane, such that three outer sides of the switch cabinet are formed from the same fabric, i.e., the two opposite side panels in the opposite outer vertical planes and, e.g., a roof element of the switch cabinet, which roof element is located in the horizontal plane In particular, the fabric may be continued in one piece from a first outer vertical plane via a horizontal plane of the switch cabinet into a second outer vertical plane opposite the first one.

The switch cabinet may have a roof element, on whose top the side panel is secured by an upper bracket. The upper bracket may be bolted to the roof element, and the side panel clamped between the top of the roof element and the bracket. Instead of a bolted connection, other optional fasteners may be provided, which are suitable for locking the bracket relative to the roof element of the switch cabinet, and for securing the fabric between them. The roof element may be designed, e.g., as a flat part, as is generally known from the prior art. It can also be provided that a bolted connection is guided through the bracket and the fabric and into the roof element.

The upper bracket may have an L-shaped web with an exposed end projecting from the roof element. The projecting exposed end may be an actuating end which, when mounting the fabric in the vertical plane, allows the fabric to be clamped to the frame profiles of the switch cabinet, particularly the frame of the switch cabinet. A suitable frame is known, e.g., from DE 10 2015 121 193 B4, wherein a circumferential outer sealing edge of the frame is arranged in the vertical plane, via which the fabric may be optimally stretched.

An EMI-shielding gasket may be arranged along an outer edge of the roof element, preferably on top of the roof element, between the fabric and the roof element, whereby the fabric is preferably prestressed under compression of the EMI-shielding gasket. Furthermore, the switch cabinet may have a base assembly, and the side panel may be secured to the underside of the floor assembly by a lower bracket. The lower bracket may be bolted to the base assembly. However, other fasteners, similar to the upper bracket, are suitable for securing the bracket to the base assembly, provided they permit locking of the bracket relative to the base assembly, which is necessary in order to position and optionally stress the fabric forming the panel in the vertical plane.

The lower support bracket may embrace a lower edge of the base assembly projecting beyond the inner periphery of the base assembly. For this purpose, the lower bracket may have a U-rounded edge, with which the lower bracket embraces the lower edge projecting from the inner circumference of the base assembly.

The lower bracket may have an L-shaped web with an exposed end projecting from the base assembly for manual actuation of the bracket, in particular for prestressing the fabric in the vertical plane.

An additional EMI-shielding gasket may be located along an outer edge of the base assembly, preferably on the bottom of the base assembly, between the fabric and the base assembly, and prestress the fabric under compression of the EMI-shielding gasket.

According to another aspect of the invention, a method of mounting a side panel on a switch cabinet of the type explained above is described, wherein the switch cabinet, in particular, has a roof element and a base assembly, which are interconnected via vertical frame profiles. This method comprises the following steps:

arranging a first EMI-shielding gasket along an upper outer edge of the roof element associated with a side panel to be mounted;

arranging a second EMI-shielding gasket along a lower outer edge of the base frame associated with the side panel to be mounted;

attaching an upper bracket to the roof element and clamping the fabric along a first edge of the fabric between the upper bracket and the roof element;

attaching a lower bracket to the base assembly and clamping the fabric along a second edge of the fabric opposite the first edge between the lower bracket and the base assembly;

tightening the fabric by locking one of the two brackets, then displacing the other bracket, and then locking the other bracket, as well.

In order to tighten the fabric, the fabric may be secured on the displaced bracket.

According to yet another aspect of the invention, a bay of switch cabinets comprising at least two adjacent switch cabinets of the type explained above is described, wherein at least one side panel located between the switch cabinets consists at least partially of a fabric with metallically coated threads or fibers.

Further areas of applicability will become apparent from the description provided herein. The description and specific examples in this summary are intended for purposes of illustration only and are not intended to limit the scope of the present disclosure.

DRAWINGS

The drawings escribed herein are for illustrative purposes only of selected embodiments and not all possible implementations, and are not intended to limit the scope of the present disclosure.

Further details of the invention will be explained with reference to the following figures. In the drawings.

DETAILED DESCRIPTION

Example embodiments will now be described more fully with reference to the accompanying drawings.

Figure 1:
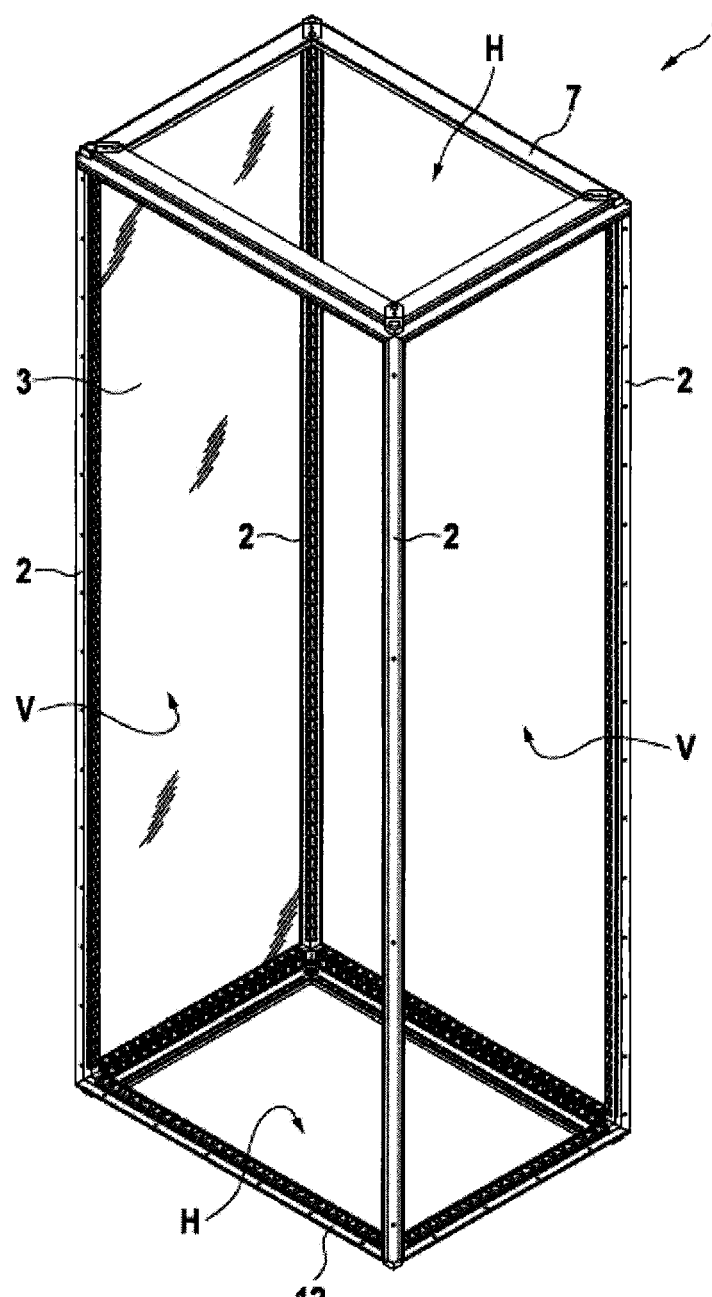
FIG. 1 shows a switch cabinet according to the prior art in a perspective view.

FIG. 1 shows a switch cabinet 1 according to prior art. Such a switch cabinet is described, e.g., in DE 10 2015 121 193 B4. The switch cabinet 1 has a frame, which consists of four vertical frame profiles 2, a roof element 7 and a base assembly 12. The shape of the roof element 7 and the base assembly 12 is substantially rectangular in shape and interconnected at their corners, and each spaced parallel to one another via one of the vertical frame profiles 2. A side panel 3 of the switch cabinet 1 is formed as a flat part, which may be, e.g., a bent molded sheet metal part.

The side panel 3 is secured in the vertical plane V to two vertical frame profiles 2, as well as the base assembly 12 and the roof element 7. If the side panel 3 of the cabinet 1 is formed as a molded sheet metal part, then it has excellent EMV-shielding. On the other hand, with a material thickness of, say, 1.5 mm, its installation height becomes substantial, which complicates the baying of identical switch cabinets, as shown in FIG. 1.

Figure 2:
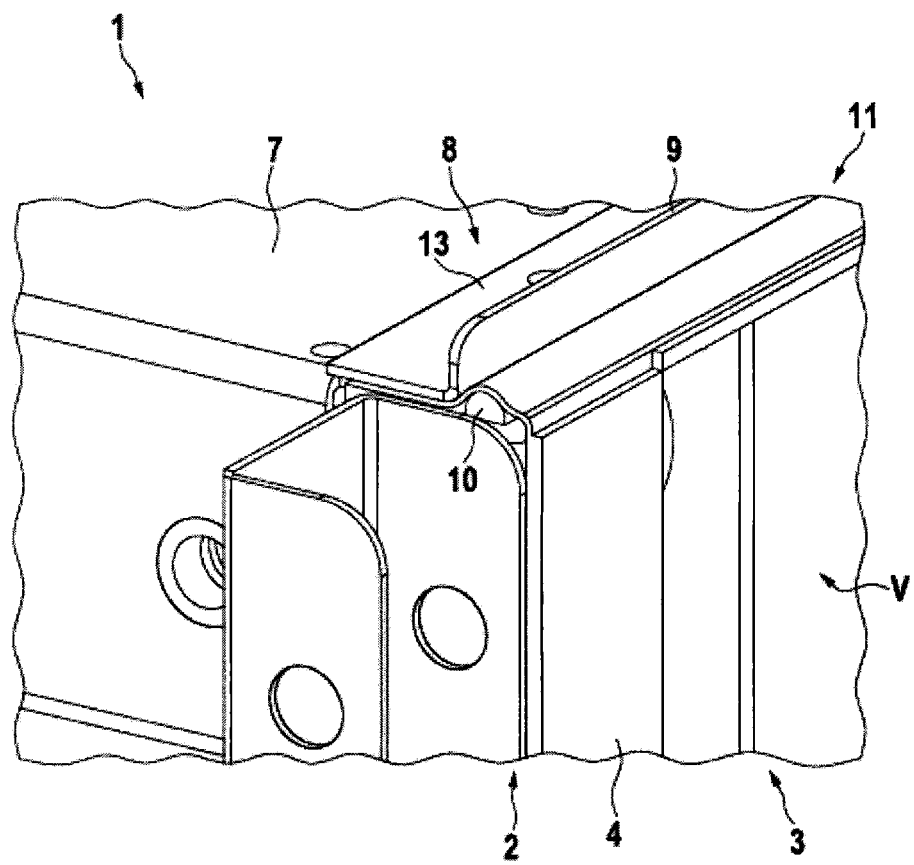
FIG. 2 shows an inventive switch cabinet according to an embodiment of the invention in perspective detail view in the area of an upper corner of the switch cabinet.

This problem can be solved by the exemplary embodiment shown in FIG. 2 of a cabinet 1 according to the invention. It is accordingly provided that a side panel 3 is arranged in at least one of the vertical planes V of the switch cabinet 1, which side panel consists at least partially of a fabric 4 with metallic coated threads or fibers. Preferably, the side panel 3 is formed in substantial parts of such a fabric 4. In particular, it may be provided that the side panel 3, at least to the extent that it is arranged in the vertical plane V, consists of such a fabric, such that it may yet consist of another material in the edge area allowing for fasteners of a different material to be provided. However, as shown in FIG. 2, it is possible to make the side panel 3 entirely from the fabric described above.

This is achieved by continuing the fabric 4 arranged in the vertical plane V in an upper edge area around an outer edge 11, along which the roof element 7 changes into the side panel 3 on a top of the roof element 7, such that it may be clamped to the top of the roof element 7 by means of an upper bracket 8. In order to achieve effective sealing against electromagnetic radiation, an EMI-shielding gasket 10 is formed on top of the roof element 7, which shielding gasket is arranged between the fabric 4 and the top of the roof element 7, such that the fabric 4 spans the EMI-shielding gasket 10, while seated sealingly against the EMI-shielding gasket 10.

The upper bracket 8 has an L-shaped web 13 with an exposed end 9, with which the bracket 8 can be displaced parallel to the top of the roof element 7 in order to stress the fabric 4. The EMI-shielding gasket is arranged between the outer edge 11 of the roof element 7 and the bracket 8 on top of the roof element 7, such that by stressing the fabric 4, the contact pressure of the fabric 4 on the EMI-shielding gasket 10 varies, as well, whereby the compression of the gasket 10 and hence the sealing effect can be varied The sealing of the fabric 4 against the roof element 7 is further facilitated in that the fabric, which may be, e.g., a woven fabric, can have a natural inherent elasticity, such that effective stretching of the fabric 4 over the edge 11 and the sealing element 10 is possible by displacing the upper bracket 8.

Further details on the attachment of the fabric 4 on the roof element 7 or base assembly 12 will be explained with reference to the embodiment according to FIGS. 3 and 4.

Figure 3:
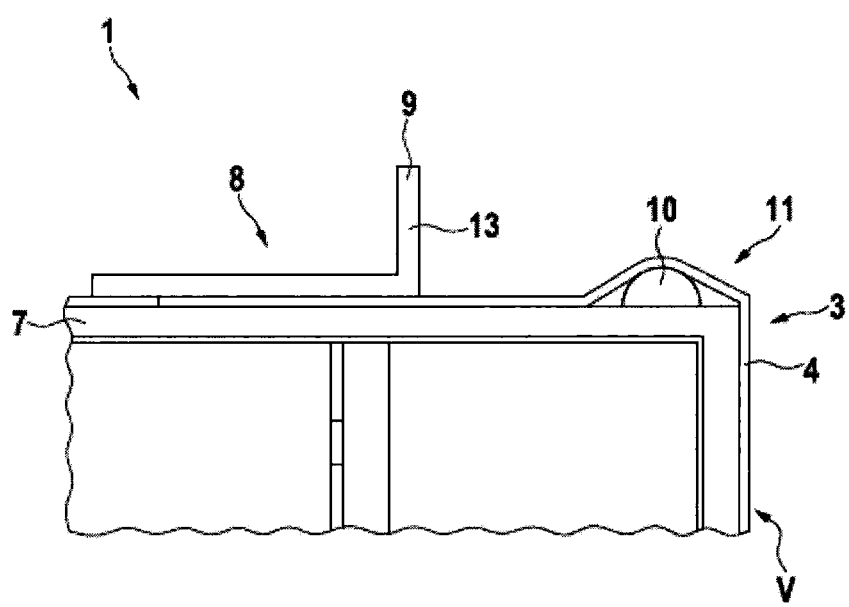
FIG. 3 shows another embodiment of a cabinet according to the invention in the area of the roof element, and in cross section perpendicular to the vertical plane and the horizontal plane.
Figure 4:
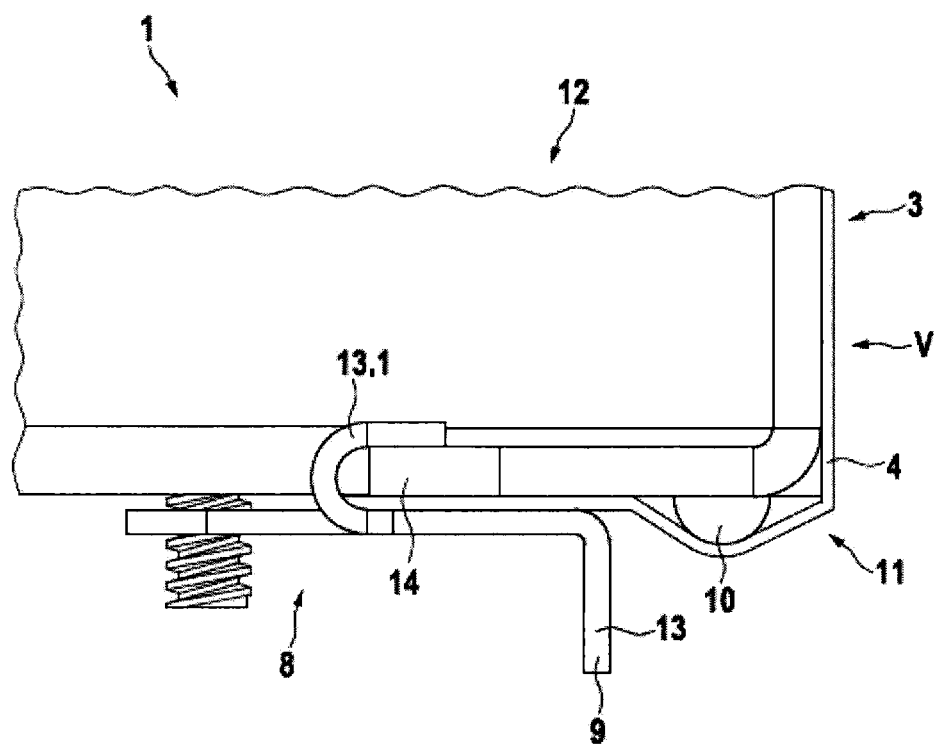
FIG. 4 shows the embodiment according to FIG. 3 in the area of the base assembly and in cross-section perpendicular to the vertical plane and horizontal plane.

As shown in FIGS. 3 and 4, the fabric 4 forming the side panel 3 and extending in the vertical plane V between the roof element 7 and the base assembly 12 may extend in one piece on an underside of the base assembly 12 over the whole length of the vertical plane V to the top of the roof element 7. The one-piece fabric 4 may be secured along a first of two opposite edges 11 by means of an upper bracket 8 on top of the roof element 7 and on a second edge 11 opposite the first edge 11 by means of a lower bracket 8 on the underside of the base assembly 12. For example, the top bracket 8 may be bolted to the roof element 7 through the fabric 4 by means of a bolted connection. To allow for stressing of the fabric 4, the upper bracket 8 may be attached to the top of the roof element 7 at a variable distance from the vertical plane. For this purpose, the upper bracket 8 may have, e.g., a slot which extends parallel to the roof element 7 and perpendicular to the vertical plane V.

The lower bracket 8, according to FIG. 4, may be adapted to be permanently secured in exactly one particular position on the base assembly 12 with a lower edge of the fabric 4 clamped between the lower bracket 8 and the underside of the base assembly 12. Unlike the upper bracket 8, as shown in FIG. 3, it may be provided that the lower bracket 8, as shown in FIG. 4, may not be displaceable in the direction perpendicular to the vertical plane V. The lower bracket 8 is different in particular from the upper bracket 8 in that it has a U-rounded edge 13.1, with which it embraces a lower edge 14 of the base assembly 12 projecting from the inner circumference of the base assembly By comparing FIGS. 3 and 4, it can be seen that the fabric 4 forming the side panel 3 in the vertical plane V is guided in one piece between the underside of the base assembly 12 and the top of the roof element 7, in each case, about an outer edge 11 of the base assembly 12 and the roof element 7, respectively, whereby an EMI-shielding gasket 10, associated with the respective outer edge 11, is arranged on the underside of the base assembly 12 and on top of the roof element 7. The fabric 4 is stretched from the vertical plane V around the outer edges 11 and over the EMI-shielding gaskets 10, and clamped with its opposite edges to the underside of the base assembly 12 or the top of the roof element 7.

Figure 5:
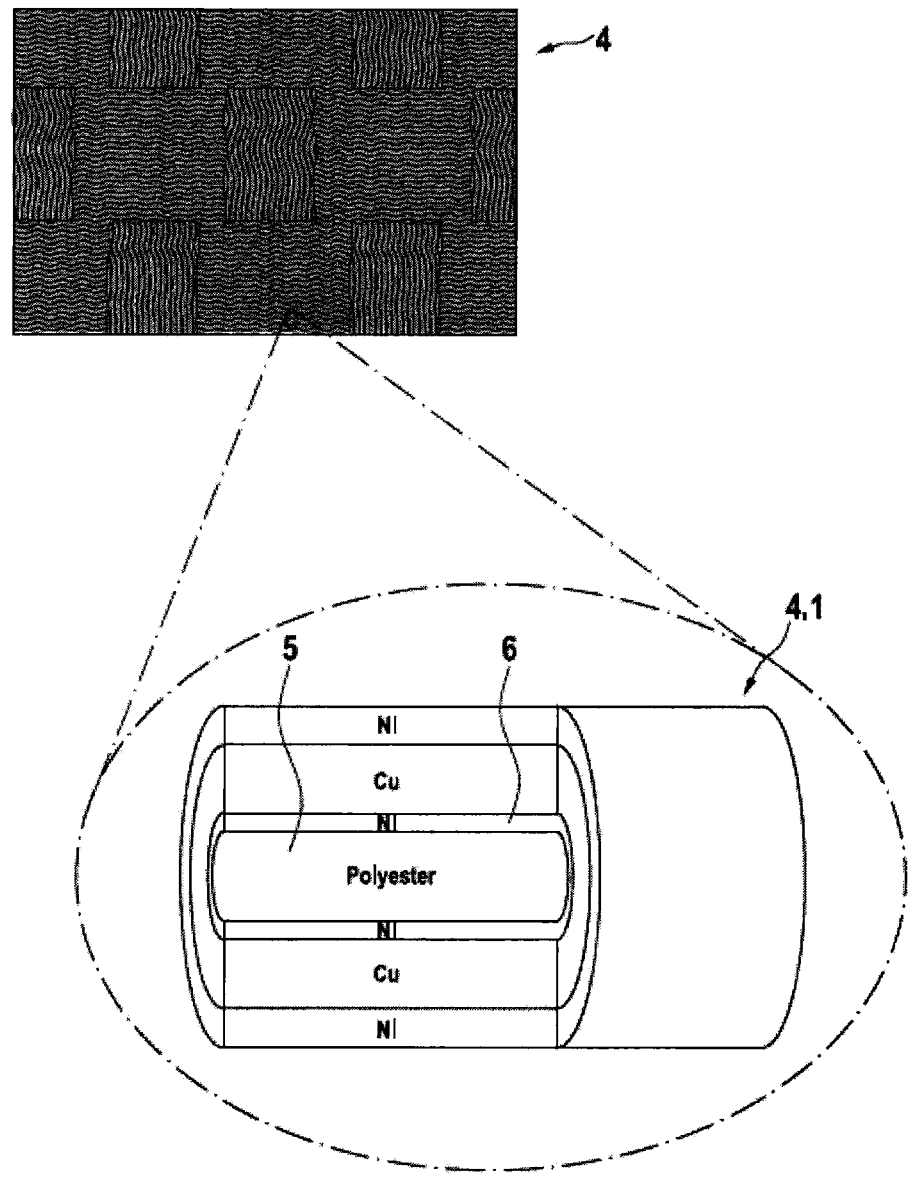
FIG. 5 shows an exemplary fabric.

FIG. 5 shows an exemplary fabric 4 and a schematic enlarged illustration of a section of a thread or a fiber 4.1, from which the fabric is made. The fabric 4 shown in FIG. 5 may be formed in the manner of a woven fabric. The thread 4.1 of the fabric has a polyester core 5, which is sheathed by a metallic layer. The metallic layer has two layers of nickel and one layer of copper. The polyester core is sheathed by a first layer of nickel. The copper layer is embedded between the first nickel layer and a second outer nickel layer.

The features of the invention disclosed in the above description, in the drawings and the claims may be essential to the realization of the invention either separately or in any combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A switch cabinet comprising a plurality of vertical frame profiles, whereby outer vertical planes (V) are defined, wherein at least one side panel of the switch cabinet is arranged in at least one of the vertical planes (V), wherein the side panel is at least partially made of a fabric with metallic or metallically coated threads or fibers; and wherein the fabric is continued on one piece from a first of the outer vertical planes (v) via a horizontal plane (H) of the switch cabinet into a second of the outer vertical planes (V) lying opposite the first.

2. The switch cabinet according to claim 1, in which the threads or fibers of the fabric have a polyester core with a metallic sheathing, in particular a copper-nickel sheathing.

3. The switch cabinet according to claim 1, in which two opposite side panels of the switch cabinet, which are arranged in opposite outer vertical planes (V) and opposite one another, are formed at least partially with the same fabric web.

4. The switch cabinet according to claim 1, which has a roof element on the upper side of which the side panel is secured by means of an upper bracket.

5. The switch cabinet according to claim 4, in which the upper retaining clip is bolted to the roof element and the side panel is clamped between the upper side of the roof element and the bracket.

6. The switch cabinet according to claim 4, in which the upper bracket has an L-shaped web with an exposed end projecting from the roof element.

7. The switch cabinet according to claim 1, wherein an EMI-shielding gasket is arranged along an outer edge of the roof element, preferably on the upper side of the roof element, between fabric and roof element, and the fabric is prestressed under compression of the EMI-shielding gasket.

8. The switch cabinet according to claim 7, wherein the lower bracket embraces a lower edge of the base assembly projecting from the inner circumference of the base assembly.

9. The switch cabinet according to claim 7, wherein the lower bracket has an L-shaped web with an exposed end projecting from the base assembly.

10. The switch cabinet according to claim 7, wherein a further EMI shielding gasket is arranged along an outer edge of the base assembly, preferably on the underside of the base assembly, between the fabric and the base assembly, and the fabric is prestressed under compression of the EMI-shielding gasket.

11. The switch cabinet according to claim 1, which has a base assembly, and the side panel is secured to the underside of the base assembly via a lower bracket.

12. The switch cabinet according to claim 11, wherein the lower retaining clip is bolted to the base assembly.

13. The switch cabinet bay comprising at least two adjoining switch cabinets according to claim 1, wherein at least one side panel located between the switch cabinets is made at least partly of a fabric with metallic or metallically coated threads or fibers.

14. A method of mounting a side panel to a switch cabinet according to claim 1, wherein the switch cabinet has a roof element and a base assembly interconnected via vertical frame profiles, and wherein the method comprises:
    arranging a first EMI-shielding gasket along an upper outer edge of the roof element associated with a side panel to be mounted;
    arranging a second EMI-shielding gasket along a lower outer edge of the base frame associated with the side panel to be mounted;
    attaching an upper bracket to the roof element and clamping the fabric along a first edge of the fabric between the upper bracket and the roof element;
    attaching a lower bracket to the base assembly and clamping the fabric along a second edge of the fabric opposite the first edge between the lower bracket and the base assembly; and
    tightening the fabric by locking one of the two brackets, then displacing the other bracket and then locking the other bracket, as well.

* * * * *